(12) United States Patent
Liu

(10) Patent No.: US 9,886,148 B2
(45) Date of Patent: Feb. 6, 2018

(54) TOUCH SCREEN, METHOD FOR PRODUCING TOUCH SCREEN, TOUCH DISPLAY DEVICE

(71) Applicants: Boe Technology Group Co., Ltd., Beijing (CN); Hefei Xinsheng Optoelectronics Technology Co., Ltd., Anhui (CN)

(72) Inventor: Guodong Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 14/769,217

(22) PCT Filed: Nov. 24, 2014

(86) PCT No.: PCT/CN2014/092038
§ 371 (c)(1),
(2) Date: Aug. 20, 2015

(87) PCT Pub. No.: WO2015/117468
PCT Pub. Date: Aug. 13, 2015

(65) Prior Publication Data
US 2016/0077628 A1    Mar. 17, 2016

(30) Foreign Application Priority Data
Sep. 16, 2014 (CN) .......................... 2014 1 0472024

(51) Int. Cl.
G06F 3/044 (2006.01)
G06F 3/041 (2006.01)
(Continued)

(52) U.S. Cl.
CPC .............. *G06F 3/044* (2013.01); *G06F 3/041* (2013.01); *G06F 2203/04103* (2013.01);
(Continued)

(58) Field of Classification Search
None
See application file for complete search history.

(56) References Cited

FOREIGN PATENT DOCUMENTS

| CN | 101546241 | 9/2009 |
| CN | 101853101 | 10/2010 |

(Continued)

OTHER PUBLICATIONS

International Search Report and Written Opinion from PCT/CN14/092038 dated Jun. 16, 2015.
(Continued)

*Primary Examiner* — Kenneth B Lee, Jr.
(74) *Attorney, Agent, or Firm* — Calfee, Halter & Griswold LLP

(57) ABSTRACT

The embodiments of the invention disclose a touch screen, a method for producing a touch screen, and a touch display device, which relate to a field of display. The touch screen does not need bridging, have high transmittance, and are simple in process, which can not only reduce the production cost but also achieve a high yield of mass production. The touch screen as provided in the embodiments of the invention comprises: a transparent substrate; a first patterned transparent eclectically conductive layer; a patterned insulating layer and a second patterned transparent eclectically conductive layer, which are formed above said transparent substrate successively, wherein among said first patterned transparent electrically conductive layer and said second patterned transparent electrically conductive layer, one is formed with a plurality of drive lines, and the other is formed with a plurality of induction lines; the pattern of said
(Continued)

insulating layer is identical with that of said first patterned transparent electrically conductive layer, or identical with that of said second patterned transparent electrically conductive layer.

18 Claims, 2 Drawing Sheets

(51) Int. Cl.
    *H05K 3/02*     (2006.01)
    *H05K 3/46*     (2006.01)

(52) U.S. Cl.
    CPC .... *G06F 2203/04104* (2013.01); *H05K 3/027* (2013.01); *H05K 3/467* (2013.01); *H05K 3/4647* (2013.01); *H05K 2201/0108* (2013.01); *H05K 2201/0326* (2013.01); *H05K 2201/10128* (2013.01); *H05K 2203/0361* (2013.01); *H05K 2203/0502* (2013.01)

(56) References Cited

FOREIGN PATENT DOCUMENTS

| | | |
|---|---|---|
| CN | 103456392 | 12/2013 |
| CN | 103500043 | 1/2014 |
| CN | 103744554 | 4/2014 |
| WO | 2013/146859 | 10/2013 |

OTHER PUBLICATIONS

Second Office Action for Chinese Patent Application No. 201410472024.7 dated Apr. 17, 2017.
Third Office Action for Chinese Patent Application No. 2014472024.7 dated Aug. 1, 2017.
Office action from Chinese Application No. 201410472024.7 dated Oct. 8, 2016.

TOUCH SCREEN, METHOD FOR PRODUCING TOUCH SCREEN, TOUCH DISPLAY DEVICE

RELATED APPLICATIONS

The present application is the U.S. national phase entry of PCT/CN2014/092038, with an international filing date of Nov. 24, 2014, which claims the benefit of Chinese Patent Application No. 201410472024.7, filed Sep. 16, 2014, the entire disclosure of which is incorporated herein by reference.

FIELD OF THE INVENTION

The present invention relates to the field of display technology, in particular relates to a touch screen, a method for producing the touch screen, and a touch display device.

BACKGROUND OF THE INVENTION

Touch display has been developed rapidly and has gradually been developed into a main-trend flat-panel display. At present, the touch display is mostly manufactured by laminating a touch screen having touch control function to a display panel. And the touch screen is often of capacitive sensing, when a finger (or other object) approaches or touches the touch screen, it would influence the capacitance between a drive line and an induction line which intersect each other around a touch point. The position of the touch point can be identified by detecting a change in the capacitance between the drive line and the induction line.

With consumers' requirement for thinning of the touch display, technologists have developed many techniques to produce thinner products with better display quality, wherein one glass solution (OGS) is an important development direction of thinning. OGS is a technique of directly forming a protective film and an inductive layer on the protective glass of the display panel. One sheet of glass simultaneously plays roles of protection and a touch control sensor. The OGS technique has the following advantages: being simple in structure, light, thin, and having good light transmittance. Moreover, due to omission of one transparent substrate and a laminating procedure, the production cost can be saved and the yield of the product can be enhanced.

Currently, the main-trend OGS touch screen structure substantially has a drive line and a induction line formed in the same layer, one of them is a continuous structure, and the other one is an interconnected structure using metal bridging (or ITO bridging), wherein the coating procedure for preparing the metal bridging is one of the factors leading to complicated procedures and difficult control of the product quality. Moreover, such bridging structure easily causes the phenomenon of breakdown at bridging due to ESD (Electro-Static discharge), influencing the touch control function. On the other hand, it is easy to see the whitening phenomenon of metal connection lines of the metal bridging structure under illumination, influencing the transmittance and display quality.

SUMMARY OF THE INVENTION

The embodiments of the invention provide a touch screen, a method for producing a touch screen, and a touch display device. The touch screen structure do not need bridging, have high transmittance, and are simple in process, which can not only reduce the production cost but also achieve a high yield of mass production.

In order to alleviate or avoid the above problems, the embodiments of the present invention employ the following technical solutions:

a touch screen, comprising: a transparent substrate, a first patterned transparent electrically conductive layer, a patterned insulating layer and a second patterned transparent electrically conductive layer, the first patterned transparent electrically conductive layer, the patterned insulating layer and the second patterned transparent electrically conductive layer being formed successively above said transparent substrate, wherein among said first patterned transparent electrically conductive layer and said second patterned transparent electrically conductive layer, one is formed with a plurality of drive lines, and the other is formed with a plurality of induction lines; the pattern of said patterned insulating layer is identical with that of said first patterned transparent electrically conductive layer, or identical with that of said second patterned transparent electrically conductive layer.

Further, said touch screen may further comprise: a protective layer, formed on said second patterned transparent electrically conductive layer.

Further, said touch screen may further comprise: a shadow eliminating layer, formed below said first patterned transparent electrically conductive layer.

Further, said touch screen may further comprise: a black matrix located at the edge of said touch screen for preventing edge light leakage.

In an embodiment, said black matrix is formed on said transparent substrate and located below said shadow eliminating layer.

In an embodiment, said black matrix is formed after said second patterned transparent electrically conductive layer and formed before said protective layer.

In an embodiment, said transparent substrate may be a protective substrate of a display panel.

In an embodiment, said patterned insulating layer may be formed by any one or more of the following materials: $SiO_2$, SiNx, and an organic transparent insulating material.

In an embodiment, said shadow eliminating layer may comprise an $Nb_2O_5$ film layer and a $SiO_2$ film layer, or said shadow eliminating layer may comprise an $Nb_2O_5$ film layer and a SiNx film layer.

In an embodiment, said protective layer may be formed by any one or more of the following materials: OC, $SiO_2$, and SiNx.

The embodiments of the present invention further provide a touch display device, comprising any touch screen among the preceding touch screens.

On the other hand, the embodiments of the invention further provide a method for producing a touch screen, comprising:

a procedure of forming a first patterned transparent electrically conductive layer;

a procedure of forming a patterned insulating layer;

a procedure of forming a second patterned transparent electrically conductive layer;

wherein among said procedure of forming a first patterned transparent electrically conductive layer and said procedure of forming a second patterned transparent electrically conductive layer, one procedure can form a plurality of drive lines, and the other procedure can form a plurality of induction lines; the formed pattern of said patterned insulating layer is identical with that of said first patterned transparent electrically conductive layer, or identical with that of said second patterned transparent electrically conductive layer.

Further, said method may further comprise: a procedure of forming a protective layer after said procedure of forming a second patterned transparent electrically conductive layer.

Further, said method may further comprise: a procedure of forming a shadow eliminating layer before said procedure of forming a first patterned transparent electrically conductive layer.

Further, said method may further comprise: a procedure of forming a black matrix before said procedure of forming a protective layer.

In an embodiment, in said procedure of forming a first patterned transparent electrically conductive layer and/or said procedure of forming a second patterned transparent electrically conductive layer, said first patterned transparent electrically conductive layer or said second patterned transparent electrically conductive layer is formed using a photolithography process or laser etching process.

The embodiments of the invention provide a touch screen, a method for producing a touch screen, and a touch display device. Said touch screen may comprise a first patterned transparent electrically conductive layer, a patterned insulating layer and a second patterned transparent electrically conductive layer, successively; wherein among said first patterned transparent electrically conductive layer and said second patterned transparent electrically conductive layer, one is formed with a plurality of drive lines, and the other is formed with a plurality of induction lines; said first patterned transparent electrically conductive layer is separated from said second patterned transparent electrically conductive layer by said patterned insulating layer. Accordingly, bridging is not required and the transmittance is high. The pattern of said patterned insulating layer may be identical with that of said first patterned transparent electrically conductive layer or said second patterned transparent electrically conductive layer. The production may employ one-time patterning process. The production process is simple, which can not only reduce the production cost but also achieve a high yield of mass production.

BRIEF DESCRIPTION OF THE DRAWINGS

In order to set forth technical solutions of the embodiments of the present invention more clearly, the figures needed to be used in the embodiments are introduced simply as follows. Obviously, the figures described below are just some embodiments of the invention. Those ordinarily skilled in the art may further obtain other figures according to said figures without spending inventive efforts.

REFERENCE SIGNS

100—a transparent substrate
200—a black matrix
300—a shadow eliminating layer
400—a first patterned transparent electrically conductive layer
500—a patterned insulating layer
600—a second patterned transparent electrically conductive layer
700—a protective layer

DETAILED DESCRIPTION OF THE INVENTION

Next, the technical solutions of the embodiments of the invention will be clearly and comprehensively described in combination with the figures of the embodiments of the invention. Obviously, the described embodiments are only part of the embodiments of the invention, rather than all of them.

Figure 1:
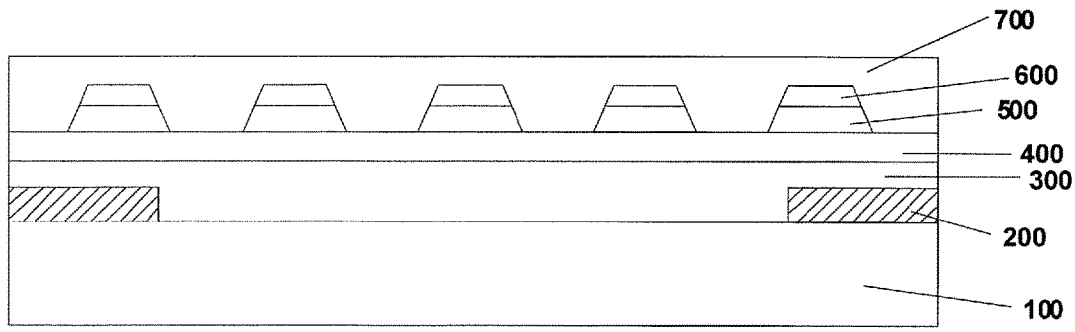
FIG. 1 is a sectional view of a touch screen as provided in one embodiment of the invention.

An embodiment of the present invention provides a touch screen, and the sectional view thereof is shown in FIG. 1. The touch screen may comprise: a transparent substrate 100, a first patterned transparent electrically conductive layer 400, a patterned insulating layer 500, and a second patterned transparent electrically conductive layer 600, wherein the first patterned transparent electrically conductive layer 400, the patterned insulating layer 500 and the second patterned transparent electrically conductive layer 600 may be successively formed above the transparent substrate 100; among the first patterned transparent electrically conductive layer 400 and the second patterned transparent electrically conductive layer 600, one can be formed with a plurality of drive lines, and the other one can be formed with a plurality of induction lines; the pattern of the patterned insulating layer 500 may be identical with that of the second patterned transparent electrically conductive layer 600.

In this embodiment, the first patterned transparent electrically conductive layer 400 and the second patterned transparent electrically conductive layer 600 are respectively arranged, separated by the patterned insulating layer 500. Among these two layers (400 and 600), if one is formed with drive lines, the other one is formed with induction lines. The specific patterns and design requirement may be any one of those well-known to those skilled in the art, as long as the drive lines and the induction lines are respectively formed in their respective film layers. Moreover, the drive lines and the induction lines may intersect each other, separated by the insulating layer. Thus, bridging is not required, which will not be repeated here. The insulating layer 50 between the two layers (400 and 600) may also be patterned, and the pattern thereof may be identical with that of the second patterned transparent electrically conductive layer 600, namely, the insulating layer 500 may have a pattern identical with that of the second patterned transparent electrically conductive layer 600. Certainly, the pattern of the insulating layer 500 may also be identical with that of the first patterned transparent electrically conductive layer 400. The material of the insulating layer 500 may be $SiO_2$, SiNx, or other organic or inorganic materials having insulating and transparent property. As compared to the existing touch screen structures provided with a bridging structure, the touch screen of this embodiment has the following advantages:

1. Bridging is not required. Multi-point touch control can be implemented only by using two patterned ITO layers and one insulating layer. The product is light and thin. Moreover, since the insulating layer 500 in this embodiment may be patterned, the transmittance of the touch screen may be notably improved as compared to the existing touch screens provided with a bridging structure.

2. It is not required to set a bridging structure for the touch screen of this embodiment, thus the transparent electrically conductive layers (ITO) for forming drive lines and induction lines do not need to climb, and the formed drive lines and induction lines do not have bridging points (contact points between bridging and ITO). It can notably improve the anti-electrostatic breakdown ability of the product.

3. As compared to conventional touch screens provided with a metal bridging structure, the touch screen of this embodiment of the present invention can effectively alleviate or avoid the problem of whitening of metal connection lines of the metal bridging structure, which is easy to see under illumination, improving the display effect of the product.

4. The production process is simple and it is not required to set metal bridging, thus the metal film deposition procedure for the metal bridging can be omitted, the existing problem of ITO climbing would not occur, and the product quality is easy to manage and control, which can not only reduce the production cost but also improve the yield of mass production. The quality of product is stable and the efficiency of production is improved.

Further, the touch screen of this embodiment may further comprise: a protective layer 700 formed on the second patterned transparent electrically conductive layer 600. The protective layer 700 may provide protection for the touch control structure, which may be OC, $SiO_2$, SiNx or other transparent inorganic or organic materials having insulating property, wherein the full name of the OC is Over Coat, which is a transparent and insulating photoresist providing protection for a black matrix (BM), a metal layer, etc. and reducing the height difference between respective layers.

Further, the touch screen may further comprise: a black matrix 200 located at the edge of the touch screen for avoiding edge light leakage, which can be formed on the transparent substrate 100 and located below the first patterned transparent electrically conductive layer 400.

Further, the touch screen may further comprise a shadow eliminating layer 300 formed above the black matrix 200 and located below the first patterned transparent electrically conductive layer 400, wherein the material of the shadow eliminating layer 300 may be a composite material of $Nb_2O_5$ and $SiO_2$, or a composite material of $Nb_2O_5$ and SiNx. For example, the shadow eliminating layer 300 may comprise an $Nb_2O_5$ film layer and a $SiO_2$ film layer, or the shadow eliminating layer 300 may comprise an $Nb_2O_5$ film layer and a SiNx film layer. The shadow eliminating layer 300 may also be other film layers having shadow eliminating effect. Arrangement of the shadow eliminating layer 300 may effectively alleviate shadow phenomenon in the touch screen under illumination, improving the display effect.

It is noted that the shadow eliminating layer 300 can exert the shadow eliminating effect as long as it is located below the first patterned transparent electrically conductive layer 400. The black matrix 200 can be formed on the transparent substrate 100, or formed on anyone of the first patterned transparent electrically conductive layer 400, the insulating layer 500, the second patterned transparent electrically conductive layer 600 and the shadow eliminating layer 300, as long as its production can meet the requirement of process.

Considering that the material of the black matrix 200 may be unable to resist severe environment such as high temperature, the black matrix 200 may be formed on the transparent substrate 100 and located below the shadow eliminating layer 300. The shadow eliminating layer 300 may provide protection for the black matrix 200 in subsequent procedures. Alternatively, the procedure of forming the black matrix 200 is performed later, namely, the black matrix 200 is formed after the second transparent electrically conductive layer 600 and before the protective layer 700.

The touch screen provided in this embodiment has a simple structure and does not need bridging. It has strong anti-electrostatic breakdown ability and high transmittance. The product is light and thin, and has good display effect. Moreover, the production process is simple and would not involve the existing problem of ITO climbing. The quality of the product is easy to manage and control. It can not only reduce the production cost, but also improve the production efficiency. Furthermore, the product quality is stable and the yield of mass production is high.

Figure 2:
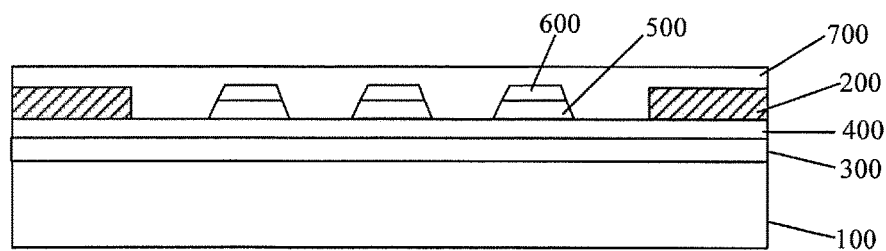
FIG. 2 is a sectional view of a touch screen as provided in another embodiment of the invention.

FIG. 2 shows a sectional view of another touch screen as provided by another embodiment of the invention. It is different from the touch screen structure as shown in FIG. 1 in that the black matrix 200 located at the edge of the touch screen for avoiding edge light leakage is formed after the first patterned transparent electrically conductive layer 400 and before the insulating layer 500. The black matrix 200 is first formed on the first patterned transparent electrically conductive layer 400, the patterned insulating layer 500 is then formed. The shadow eliminating layer 300 is formed on the transparent substrate 100 and located below the first patterned transparent electrically conductive layer 400.

Alternatively, the black matrix 200 may also be formed on the second patterned transparent electrically conductive layer 600 and located below the protective layer 700, namely, the black matrix 200 is formed after the second patterned transparent electrically conductive layer 600, and then the protective layer 700 is formed.

Except for that stated above, the touch screen as provided in this embodiment of the invention is substantially similar to that as provided in previous embodiment, which will not be explained in detail. In an embodiment, the insulating layer 500 may be formed by any one or more of the following materials: $SiO_2$, SiNx, and organic transparent materials. In an embodiment, the shadow eliminating layer 300 may be a composite film layer of $Nb_2O_5$ and $SiO_2$, or a composite film layer of $Nb_2O_5$ and SiNx. In an embodiment, the protective layer 700 may be formed by any one or more of the following materials: OC, $SiO_2$ and SiNx.

It is noted that the touch screen structure as provided in this embodiment may individually form a product having touch control function, such as a touch screen. The touch screen structure as provided in this embodiment may also be directly formed on a protective substrate of a display panel using OGS technique, and at that time the transparent substrate in this embodiment is namely the protective substrate of the display panel.

The touch screen provided in this embodiment has a simple structure and does not need bridging. It has strong anti-electrostatic breakdown ability and high transmittance. The product is light and thin, and has good display effect. Moreover, the production process is simple and would not involve the existing problem of ITO climbing. The quality of the product is easy to manage and control. It can not only reduce the production cost but also improve the production efficiency. Furthermore, the product quality is stable and the yield of mass production is high.

An embodiment of the invention further provides a touch display device comprising any one of the preceding touch screens. Due to usage of the above touch screen structure, the touch display device has advantages of strong anti-electrostatic breakdown ability and high transmittance. The product is light and thin, and has good display effect. Moreover, the production process is simple and would not involve the existing problem of ITO climbing. The quality of the product is easy to manage and control. It can not only reduce the production cost but also improve the production efficiency. Furthermore, the product quality is stable and the yield of mass production is high.

The display device may be any product or component having display touch function such as a liquid crystal panel, an electronic paper, an OLED panel, a mobile phone, a tablet computer, a television, a display, a notebook, a digital photo frame, a navigator, and so on.

Figure 3:
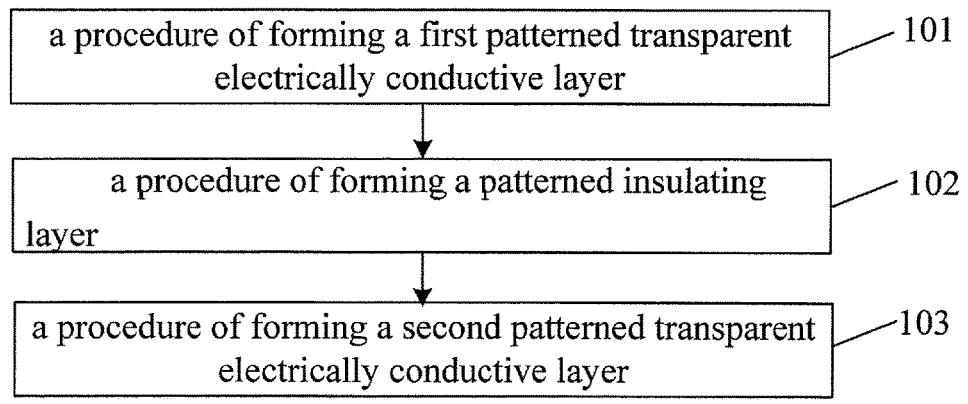
FIG. 3 is a flow chart of a method for producing a touch screen as provided in one embodiment of the invention.

On the other hand, an embodiment of the invention further provides a method for producing a touch screen. As shown in FIG. 3, the method may comprise:

101, a procedure of forming a first patterned transparent electrically conductive layer;

102, a procedure of forming a patterned insulating layer;

103, a procedure of forming a second patterned transparent electrically conductive layer;

wherein, as shown in FIGS. 1 and 2, among the procedure 101 of forming a first patterned transparent electrically conductive layer 400 and the procedure 103 of forming a second patterned transparent electrically conductive layer 600, one procedure can form a plurality of drive lines, and the other procedure can form a plurality of induction lines; the pattern of the patterned insulating layer 500 formed in the procedure 102 may be identical with that of the first patterned transparent electrically conductive layer 400, or may be identical with that of the second patterned transparent electrically conductive layer 600.

The method for producing a touch screen as provided in this embodiment is simple in the production process and would not involve the existing problem of ITO climbing. The quality of the product is easy to manage and control. It can not only reduce the production cost but also improve the production efficiency. Moreover, the product quality is stable and the yield of mass production is high.

Further, the method for producing a touch screen may further comprise: 106, a procedure of forming a protective layer after the procedure 103 of forming a second patterned transparent electrically conductive layer; 105, a procedure of forming a shadow eliminating layer before the procedure 101 of forming a first patterned transparent electrically conductive layer; and may further comprise: 104, a procedure of forming a black matrix before or after any one of the procedures 101-103 and 105.

The procedure 104 may be performed before or after any one of the procedures of 101-103 and 105, namely, the procedure 104 may be performed before the procedure 106 of forming a protective layer. The procedure 105 needs to be performed before the procedure 101. The procedure 106 needs to be performed after forming the second patterned transparent electrically conductive layer, which is generally the last procedure.

Figure 4:
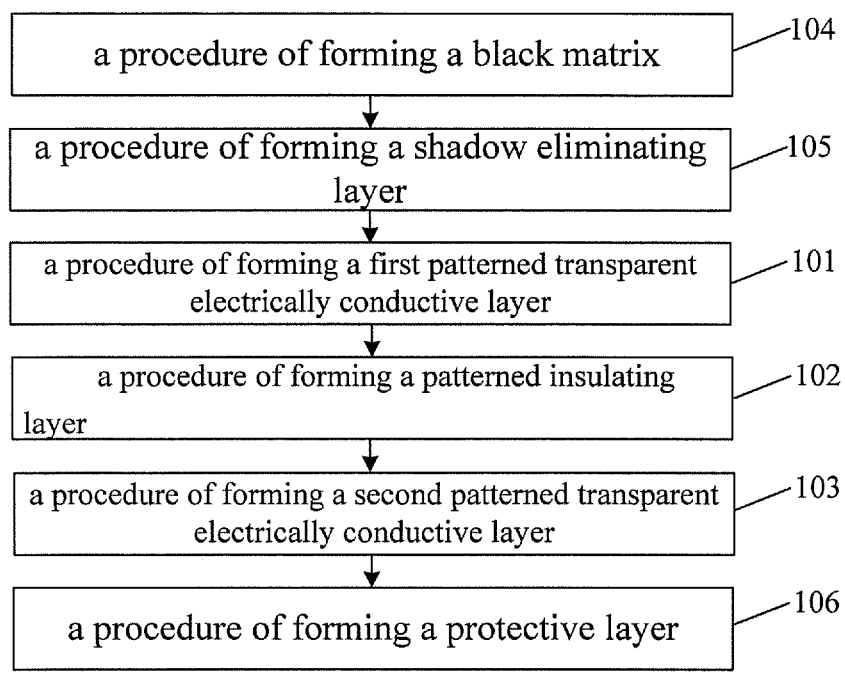
FIG. 4 is a flow chart of a method for producing a touch screen as provided in another embodiment of the invention.

In a specific embodiment as shown in FIG. 4, before the procedure 101 of forming a first patterned transparent electrically conductive layer, the method for producing a touch screen may further comprise: 104, a procedure of forming a black matrix; and 105, a procedure of forming a shadow eliminating layer; After the procedure 103 of forming a second patterned transparent electrically conductive layer, the method for producing a touch screen may further comprise: 106, a procedure of forming a protective layer.

In addition, in the procedure 101 of forming a first patterned transparent electrically conductive layer and/or the procedure 103 of forming a second patterned transparent electrically conductive layer, the first patterned transparent electrically conductive layer 400 or the second patterned transparent electrically conductive layer 600 may be formed using a photolithography process or laser etching process.

To enable those skilled in the art to better understand the method for producing a touch screen as provided in the embodiment of the invention, the method for producing a touch screen as provided in the invention is explained below in detail by specific embodiments.

An embodiment of the invention provides a method for producing a touch screen that does not need bridging and has high transmittance. Taking an OGS touch screen as an example, specific implementing steps may be as follows:

Step 1: fabricating a patterned black matrix 200 on the induction surface of a transparent substrate 100 by printing or by first forming a film and then using a photolithography process or laser etching process;

Step 2: then depositing a shadow eliminating layer 300 using a coating process;

Step 3: depositing a transparent electrically conductive layer (a first transparent electrically conductive layer) on the shadow eliminating layer 300 using a coating process, and performing a photolithography process or laser etching process for the transparent electrically conductive layer to form a first patterned transparent electrically conductive layer 400;

Step 4: depositing an insulating layer on the first patterned transparent electrically conductive layer 400 using a coating process; performing a photolithography process or laser etching process for the insulating layer to form a pattern intersecting the first patterned transparent electrically conductive layer 400;

wherein the first patterned transparent electrically conductive layer 400 and the second patterned transparent electrically conductive layer 600 may be formed with drive lines and induction lines respectively; the drive lines and the induction lines may intersect each other, separated by the insulating layer, and the pattern of the patterned insulating layer 500 may be identical with that of the second patterned transparent electrically conductive layer 600, thus it can also be regarded that the pattern formed on the insulating layer 500 intersects the pattern of the first patterned transparent electrically conductive layer 400.

Step 5: forming a second patterned transparent electrically conductive layer 600 on the insulating layer 500 by first forming a film and then using a photolithography process or laser etching process, the pattern of which may be identical with that of the insulating layer 500;

Step 6: finally depositing a protective layer 700 (e.g. OC) over the induction surface of the transparent substrate 100 (above the second patterned transparent electrically conductive layer 600 formed in Step 5).

For the above method for producing a touch screen, bridging is not required, which can omit one-time metal thin film deposition and one-time patterning process. The production process is simple and would involve the existing problem of ITO climbing. The quality of the product is easy to manage and control. In addition, the method for producing a touch screen according to this embodiment can also implement a touch control structure under the condition of laser etching process only, which does not need expensive photolithography process and device. It can greatly reduce the production cost and improve the production efficiency. Moreover, the quality of the product is stable and the yield of mass production is high.

An embodiment of the invention further provides another OGS touch screen that does not need bridging and has high transmittance, and the steps for fabricating the OGS touch screen may be as follows:

Step 1: fabricating a patterned black matrix 200 on the induction surface of a transparent substrate 100;

Step 2: then depositing a shadow eliminating layer 300 using a coating process;

Step 3: forming a first patterned transparent electrically conductive layer 400 on the shadow eliminating layer 300 by first forming a film and then using a laser etching process;

Step 4: directly forming a pattern (i.e. a patterned insulating layer 500) intersecting the first patterned transparent electrically conductive layer 400 on the first transparent electrically conductive layer 400 by printing process.

Step 5: forming a second patterned transparent electrically conductive layer 600 on the patterned insulating layer 500 by first forming a film and then using a laser etching process, the pattern of which may be identical with that of the insulating layer 500;

Step 6: finally depositing a protective layer 700 (e.g. OC) over the induction surface of the transparent substrate 100 (above the second patterned transparent electrically conductive layer 600 formed in Step 5).

Such method for producing a touch screen is simpler. The laser etching process is only needed to be used in the procedures of forming the first and second transparent electrically conductive layers. It can further reduce the production cost without influencing the quality of the product.

The method for producing a touch screen as provided in embodiments of the invention is simple in production process and would involve the existing problem of ITO climbing. The quality of the product is easy to manage and control. It can reduce the production cost and improve the production efficiency. Moreover, the quality of the product is stable and the yield of mass production is high. Furthermore, the formed touch screen is simple in structure, which does not need bridging, and has strong anti-electrostatic breakdown ability and high transmittance. The product is light and thin, and has good display effect.

The respective embodiments of the description are all described in a progressive manner. The same or similar portions between the respective embodiments may refer to each other. Each embodiment focuses the differences thereof from other embodiments. In particular, as for an embodiment of method, it is described in a relatively simpler manner since it is substantially similar to the device embodiment. Relevant portions thereof may refer to those portions of the device embodiment. The embodiments described above are only specific embodiments of the present invention. However, the protection scope of the invention is not limited to that. Any variations or alternatives that can be easily conceived by the skilled familiar with this technical field within the technical scope disclosed in the invention shall be covered within the protection scope of the invention. Thus, the protection scope of the invention shall be based on the protection scopes of the appending claims.

What is claimed is:

1. A touch screen, comprising:
a transparent substrate;
a first patterned transparent electrically conductive layer;
a patterned insulating layer; and
a second patterned transparent electrically conductive layer;
wherein said first patterned transparent electrically conductive layer, said patterned insulating layer, and said second patterned transparent electrically conductive layer are formed successively above said transparent substrate;
wherein one of the first and second patterned transparent electrically conductive layers comprises a plurality of drive lines;
wherein the other of the first and second patterned transparent electrically conductive layers comprises a plurality of induction lines;
wherein an insulating pattern of said patterned insulating layer is selected from the group consisting of a first pattern of the first patterned transparent electrically conducting layer and a second pattern of the patterned transparent electrically conducting layer; and
wherein the touch screen further comprises a shadow eliminating layer below said first patterned transparent electronically conductive layer.

2. The touch screen according to claim 1, further comprising:
a protective layer, formed on said second patterned transparent electrically conductive layer.

3. The touch screen according to claim 1, further comprising:
a black matrix located at an edge of said touch screen for preventing edge light leakage.

4. The touch screen according to claim 3, wherein said black matrix is formed on said transparent substrate and located below said shadow eliminating layer.

5. The touch screen according to claim 1, wherein said black matrix is formed after said second patterned transparent electrically conductive layer and before said protective layer.

6. The touch screen according to claim 1, wherein said transparent substrate is a protective substrate of a display panel.

7. The touch screen according to claim 2, wherein said transparent substrate is a protective substrate of a display panel.

8. The touch screen according to claim 1, wherein said patterned insulating layer is formed of at least one of: $SiO_2$, $SiN_x$, and an organic transparent insulating material.

9. The touch screen according to claim 2, wherein said patterned insulating layer is formed of at least one of: $SiO_2$, $SiN_x$, and an organic transparent insulating material.

10. The touch screen according to claim 1, wherein said patterned insulating layer is formed of at least one of: $SiO_2$, $SiN_x$, and an organic transparent insulating material.

11. The touch screen according to claim 1, wherein said shadow eliminating layer comprises:
a first film layer formed of $Nb_2O_5$; and
a second film layer formed of a material selected from the group consisting of $SiO_2$ and $SiN_x$.

12. The touch screen according to claim 2, wherein said protective layer is formed of at least one of: OC, $SiO_2$, and $SiN_x$.

13. The touch screen according to claim 1, wherein said protective layer is formed of at least one of: OC, $SiO_2$, and $SiN_x$.

14. A touch display device comprising:
a frame; and
a touch screen, the touch screen comprising:
a transparent substrate;
a first patterned transparent electrically conductive layer;
a patterned insulating layer; and
a second patterned transparent electrically conductive layer;
wherein said first patterned transparent electrically conductive layer, said patterned insulating layer and said second patterned transparent electrically conductive layer are formed successively above said transparent substrate;

wherein one of the first and second patterned transparent electrically conductive layers comprises a plurality of drive lines;

wherein the other of the first and second patterned transparent electrically conductive layers comprises a plurality of induction lines;

wherein an insulating pattern of said patterned insulating layer is selected from the group consisting of a first pattern of the first patterned transparent electrically conducting layer and a second pattern of the patterned transparent electrically conducting layer; and wherein the touch screen further comprises a shadow eliminating layer below said first patterned transparent electrically conductive layer.

15. A method for producing a touch screen, comprising:
forming a first patterned transparent electrically conductive layer;
forming a patterned insulating layer;
forming a second patterned transparent electrically conductive layer; and
forming a shadow eliminating layer before forming a first patterned transparent electrically conductive layer;

wherein one of the first and second patterned transparent electrically conductive layers comprises a plurality of drive lines;

wherein the other of the first and second patterned transparent electrically conductive layers comprises a plurality of induction lines;

wherein an insulating pattern of said patterned insulating layer is selected from the group consisting of a first pattern of the first patterned transparent electrically conducting layer and a second pattern of the patterned transparent electrically conducting layer.

16. The method according to claim 15, further comprising:
forming a protective layer after forming a second patterned transparent electrically conductive layer.

17. The method according to claim 15, further comprising:
forming a black matrix before forming a protective layer.

18. The method according to claim 15, wherein at least one of forming a first patterned transparent electrically conductive layer and forming a second patterned transparent electrically conductive layer uses a process selected from the group consisting of a photolithography process and a laser etching process.

* * * * *